(12) United States Patent
Horton et al.

(10) Patent No.: US 11,609,286 B2
(45) Date of Patent: Mar. 21, 2023

(54) MONITORING SYSTEM FOR A DETECTION SYSTEM (71) Applicant: Metrasens Limited, Malvern (GB)

(72) Inventors: Thomas John Horton, Malvern (GB); Sami Khan, Malvern (GB); Mark Nicholas Keene, Malvern (GB)

(73) Assignee: MFTRASENS LIMITED, Worcestershire (GB)

( * ) Notice: Subject to any disclaimer, the term of this patent is extended or adjusted under 35 U.S.C. 154(b) by 811 days.

(21) Appl. No.: 16/464,585

(22) PCT Filed: Nov. 24, 2017

(86) PCT No.: PCT/GB2017/053544
§ 371 (c)(1),
(2) Date: May 28, 2019

(87) PCT Pub. No.: WO2018/096354
PCT Pub. Date: May 31, 2018

(65) Prior Publication Data
US 2021/0103016 A1    Apr. 8, 2021

(30) Foreign Application Priority Data
Nov. 25, 2016  (GB) ..................... 1620012

(51) Int. Cl.
*G01R 33/28*   (2006.01)
*G01V 3/08*   (2006.01)
*G08B 13/22*   (2006.01)

(52) U.S. Cl.
CPC ........... *G01R 33/288* (2013.01); *G01V 3/081* (2013.01); *G08B 13/22* (2013.01)

(58) Field of Classification Search
CPC ....... G01R 33/288; G01V 3/081; G08B 13/22
(Continued)

(56) References Cited

U.S. PATENT DOCUMENTS 3,576,539 A  *  4/1971  Huber ..................... G07F 7/08
                                                    340/5.5
8,450,678 B2 *  5/2013  Sasaki ..................... E05F 15/74
                                                    250/221

(Continued)

FOREIGN PATENT DOCUMENTS

EP        3018489 A1    5/2016
WO    2013001292 A2    1/2013

OTHER PUBLICATIONS

UK Search Report for Application GB1620012.3 dated Mar. 15, 2017.

(Continued)

*Primary Examiner* — Kerri L McNally
*Assistant Examiner* — Thang D Tran
(74) *Attorney, Agent, or Firm* — Birch, Stewart, Kolasch & Birch, LLP (57) ABSTRACT

A monitoring system for use in combination with, in particular a ferromagnetic, detection system of the kind that generates a warning signal to indicate a detection event when the detection system detects movement of a door protecting an entrance to a protected area. The monitoring system may include a processor configured to present information to a user to alert the user when the warning signal indicates a detection event; and a user interface configured to accept a user input in response to the presentation of the detection event that generates a user generated signal indicative of whether the detection event was the result of an unintentional action or an intentional action. The processor may be configured to automatically store data relating to the detection event in a memory unit when the user generated signals indicates that the detection event was the result of an unintentional action.

29 Claims, 10 Drawing Sheets

(58) Field of Classification Search
USPC ......................................................... 340/541
See application file for complete search history.

(56) References Cited

U.S. PATENT DOCUMENTS

| | | | | |
|---|---|---|---|---|
| 2003/0137420 A1* | 7/2003 | Turner | G01V 3/08 | 340/552 |
| 2003/0174057 A1* | 9/2003 | Kim | G01V 3/105 | 340/541 |
| 2004/0135687 A1* | 7/2004 | Keene | G01V 11/00 | 340/572.6 |
| 2006/0145691 A1* | 7/2006 | Massengill | G01V 3/08 | 324/207.25 |
| 2007/0052411 A1* | 3/2007 | McClure | G01V 3/15 | 324/228 |
| 2007/0132581 A1* | 6/2007 | Molyneaux | G01R 33/288 | 340/572.1 |
| 2008/0084301 A1* | 4/2008 | Roybal | G01V 3/38 | 340/551 |
| 2009/0237247 A1* | 9/2009 | Brunetti | G08B 13/196 | 340/541 |
| 2009/0259121 A1* | 10/2009 | Simonetti | A61B 5/0044 | 482/54 |
| 2010/0013461 A1* | 1/2010 | Masubuchi | G01R 33/288 | 324/201 |
| 2010/0319256 A1* | 12/2010 | Agam | E05F 15/73 | 49/31 |
| 2011/0102597 A1* | 5/2011 | Daly | G01S 13/887 | 348/E5.085 |
| 2011/0121986 A1* | 5/2011 | Kopp | A61B 5/055 | 340/657 |
| 2012/0074943 A1* | 3/2012 | MacLeod | G01R 33/025 | 324/225 |
| 2012/0268117 A1* | 10/2012 | Romano | G01N 24/084 | 324/307 |
| 2013/0285810 A1* | 10/2013 | Wooliscroft | G01V 11/00 | 340/540 |
| 2013/0307533 A1* | 11/2013 | Keene | G01R 33/0047 | 324/244 |
| 2014/0232382 A1* | 8/2014 | Goodyear | G01V 3/08 | 324/239 |
| 2015/0033629 A1* | 2/2015 | Barwick | E06B 11/085 | 49/13 |
| 2015/0137812 A1* | 5/2015 | Rapoport | G01R 33/421 | 324/318 |
| 2015/0234079 A1* | 8/2015 | Loubet | G01V 3/15 | 324/329 |
| 2015/0279189 A1* | 10/2015 | Keene | G01V 11/002 | 340/540 |
| 2015/0370826 A1* | 12/2015 | Mraz | G06F 16/178 | 707/617 |
| 2016/0131788 A1* | 5/2016 | Kopp | G01P 13/00 | 324/228 |
| 2016/0295171 A1* | 10/2016 | Van Den Brink | G06V 20/52 | |
| 2016/0306062 A1* | 10/2016 | Keene | G01V 11/00 | |
| 2017/0293398 A1* | 10/2017 | Razurel | B60K 35/00 | |
| 2017/0310834 A1* | 10/2017 | Yamanishi | H04N 1/00493 | |
| 2018/0082140 A1* | 3/2018 | Ida | G08B 13/19682 | |
| 2018/0233013 A1* | 8/2018 | Nishikado | G08B 21/02 | |
| 2018/0286213 A1* | 10/2018 | Schueler | H04W 52/0216 | |

OTHER PUBLICATIONS

International Search Report for Application PCT/GB2017/053544 dated Feb. 22, 2018.

L.J. Orchard: Implementation of a ferromagnetic detection system in a clinical MRI setting, Radiography, vol. 21, No. 3, Jan. 3, 2015, pp. 248-253, XP055450520, Amsterdam, NL ISSN: 1078-8174, DOI: 10.1016/j.radi.2014.12.007, p. 249, p. 251, left-hand column, paragraph 5.

Frank G. Shellock et al: "Detection of Implants and Other Objects Using a Ferromagnetic Detection System: Implications for Patient Screening Before MRI", American Journal of Roentgenology, vol. 201, No. 4, Oct. 2013, pp. 720-725, XP055450593, US ISSN: 0361-803X, DOI: 10.2214/AJR.12.10332 the whole document.

* cited by examiner

MONITORING SYSTEM FOR A DETECTION SYSTEM

TECHNICAL FIELD

The present invention relates to a monitoring system for a detection system, in particular but not exclusively for use with a ferromagnetic detection system that in use protects an entrance to a protected area. It further relates to a method of logging ferromagnetic detection events related to a ferromagnetic detection system.

BACKGROUND

It is known to provide a detection system or manual screening procedure to protect an area that is to be protected. One particular example to which the invention has application is in the protection of the area containing a magnetic resonance imaging (MRI) machine. Prior to an MRI examination it is important that all ferromagnetic objects are removed from the patient. Ferromagnetic objects may be attracted to the MRI scanner's magnet causing a projectile accident. Small ferromagnetic objects such as hair pins and bra under-wires, for example, may cause serious artefacts in the MRI image that can prevent diagnosis. In this case the object needs to be removed and the patient re-scanned, which uses additional time. In addition, it is important that any implants that may be ferromagnetic are known about. Although these cannot be removed, knowledge of them is essential because they may be unsafe in an MRI, or require precautions in order to carry out a scan in a safe manner.

Ferromagnetic detection systems (FMDS) are excellent for detecting ferromagnetic objects that may otherwise be taken into an MRI whether intentionally or unintentionally. The applicants have developed a number of systems which can be installed at a doorway to an MRI room to detect ferromagnetic materials prior to MRI. By way of background, FMDS comprise a plurality of magnetic sensors arranged to detect fluctuations in the ambient magnetic field caused by ferromagnetic objects moving within their locality. The fluctuations are detected using a thresholding detector the output of which is coupled to visual and/or audible alerting devices.

Entry control FMDS are normally mounted at an MRI doorway and include a warning device which issues a visual or audible (or both) warning of large ferromagnetic objects entering that could be a major hazard. The warning device should be visible or audible (or both) the person approaching or passing through the door to give a timely warning that they can react to. These systems provide an alert whenever a ferromagnetic object is detected in order to bring this fact to the carrier's attention.

A detection event can be either intentional or unintentional. For example, it may sometimes be required for equipment containing ferromagnetic material to be brought into the MRI room. This can be allowable, for example, some patient monitors, gurneys, or IV poles have ferromagnetic content but are tested and certified to be safe near the MRI—this equipment will be labelled "MR conditional". As, for example an MR conditional piece of equipment is taken into the room the warning signal will be issued but can be disregarded as it is an intentional event that is known to be safe. On the other hand, where a ferromagnetic item is about to be unintentionally introduced into the MRI room due to either lack of knowledge or human error, for example, such an event may be potentially life-threatening. Again the warning signal will be issued and the user will react to the warning and check for ferromagnetic objects before entering the MRI room. The detection system has no way of knowing if the event was intentional or not, and sees both instances as a common detection event that leads to the raising of an alarm in each case.

Where a detection event occurs that leads to a warning being issued and which is unintentional, it may be desirable or even a legal requirement to manually log details of the event for record-keeping or audit purposes. This will highlight unusually high levels of unintentional events which may be indicative of a breakdown in general operational procedure for the MRI room. For example, each person entering the room will typically be either pre-screened for ferromagnetic objects or will be given training on the risks, so the number of logged unintentional events should be low to zero in a well-run environment. Such logged details may include date and time, names, room number, and a description of what occurred. Of course, manually logging events is time consuming and could be overlooked in a busy environment or if inadequate training is provided.

An alternative means of logging events is to use the detection signal from the FMDS to trigger the capture of still or video images of the doorway, which is well-known in the prior art. This method allows the time, date, and the identification of the people and equipment involved to be captured without any user input. However, there are several disadvantages. Firstly, such a system will capture all events that caused the FMDS to alarm as it cannot distinguish between an intentional and an unintentional event. The vast majority of recorded events will be intentional in a well-run facility so to determine the unintentional events requires manual examination of all events, and even then it may not be possible to accurately distinguish between them. A second disadvantage is the legal aspects of collecting and storing images of people. Whilst the MRI technologists may agree as part of their job, the privacy issues surrounding patients and in particular children are more sensitive.

SUMMARY

It is therefore an object of the present invention to provide a monitoring system which is capable of logging unintentional detection events and ameliorates some of the limitations inherent in manual and image-based logging systems.

According to a first aspect of the invention, there is provided a monitoring system for use in combination with a detection system of the kind that generates a warning signal to indicate a detection event when the detection system detects a detectable object; the monitoring system comprising: a processor configured to present information to a user to alert the user when the warning signal indicates a detection event;

a user interface configured to accept a user input in response to the presentation of the detection event that generates a user generated signal indicative of whether the detection event was the result of an unintentional action or an intentional action;

and in which the processor is configured to automatically store data relating to the detection event in a memory unit when the user generated signals indicates that the detection event was the result of an unintentional action.

By "intentional action" it is meant that the person initiating the action in question which resulted in a detection event knew that the action would result in such a detection event. Thus, an "unintentional action" is where the person initiating the action in question which resulted in a detection event did not know that a detection event would be the result of said action.

The detection system may be a ferromagnetic detection system and the detectable object may be a ferromagnetic object.

The monitoring system may include a display and the processor may present the information to the user by modifying one or more images presented on the display according to the status of the warning signal.

The presented information may comprise a visual representation of one or more parts of the detection system which representation varies when a detection event has occurred. Such parts may include a representation of one or more warning lights incorporated into the detection system. Where the warning light or lights are shown, the color of the light displayed on the screen may change when a detection event occurs.

The system may be at least partially located remotely from the detection system in a location where the detection system is otherwise not visible to a user. Where a monitor is provided, or an audible presenter for altering the user to a detection event, this may be located at the remote location along with the user input.

The detection system may be fitted to a doorway to an MRI room to protect the doorway and the monitor may be located in a control room remote from the doorway. In a typical MRI installation there will be a control room away from the MRI room where one or more operators may be located when the MRI machine is scanning. This will typically include monitoring information for the MRI machine that allows it to be controlled from outside of the MRI room. The display system may be located in this room alongside the control system for the MRI machine.

The processor and display may be integrated into a single housing with the user input device. This provides a self-contained device that can be easily mounted on a desktop or wall.

The monitoring system may be portable, allowing it to be moved around the room if required.

The monitoring system may be connected to the warning device by a hard-wired connection or wirelessly.

The monitoring system may include a digital memory in which the events are stored and which is accessible by the processor. This memory may also store the program instructions that are to be executed by the processor.

The processor may be configured to generate, in use, a log file that includes a set of the stored data relating to a range of unintentional events which is suitable for exporting from the device as a digital or printed record. The processor may be configured to prompt the user to select a date range for use in generating the log file. The user interface may enable the user to enter the date range as a start date and an end date, the log file being produced for events between the two dates of the range.

The log file may be automatically generated at predetermined intervals.

It may be desirable for data not to be stored when the user input indicates that the detection event was the result of an intentional action. This data may be excluded from the log file. This reduces the amount of storage needed, and also makes it easier to identify what should be a small number of unintentional events within a large number of intentional events.

The log file may comprise an electronic data file, for instance in a format that can be opened by a proprietary computer program such as Microsoft Excel.

At least part of the data that is stored may be obtained from the detection system. The data may also or otherwise include data from elsewhere other than the detection system.

The data may include the time of the event. This may be obtained from a clock built into the monitoring system.

The data may include a still camera image or video recording of the area that is protected by the ferromagnetic detection system, and/or the magnitude of the ferromagnetic signal that triggered the detection event. The monitoring system may receive the image or video from a camera or video recorder that monitors the scene including the protected area. The camera or video recorder may be provided as a part of the monitoring system if one is not otherwise provided.

The data may include other information useful to measuring the safety or efficiency of the MRI workflow. FMDS may generate signals other than ferromagnetic alerts. For example, they may detect entry events when a light beam across the MRI door is crossed. Some of these can additionally determine the direction i.e. whether a person or object has entered or exited the room. The monitoring and logging system may count these events to provide a measure of the usage of a particular MRI. Another example is the FMDS may record the presence of people or equipment that have been tagged for the purposes of modifying the FMDS alarm response. The monitor may therefore log the usage of tagged equipment. This may help the facility to know which equipment is heavily used and will need replacing soonest. A third example is making use of door sensors that are present on some FMDS. The relative amount of time a door is open has safety implications. For example, the monitor can determine in conjunction with data from the other examples above whether a door has been left open with no entry or exit events occurring—a potentially risky occurrence. On recognition of this situation the monitor may issue an audible or visual alert and may log the event.

In general it will be appreciated that the monitoring system described herein may register and log any data that is generated within the detector. Furthermore, it may make decisions to display a range of information or to provide warnings based on its inputs.

The monitoring system may include a receiver configured to receive the warning signal from the ferromagnetic detection system upon the occurrence of a detection event, the processor acting on the signal received from the receiver.

The user interface may comprise a button.

Such a button may be an on-screen button in which case the monitor may include a touch sensitive display on which the button is generated by the processor.

Two on screen buttons may be provided, one for the user to touch when a detection event was unintentional and the other for the user to touch when a detection event was intentional. The same can be provided with two physical buttons. In each case a user input is created which is fed to the processor for processing.

In one preferred arrangement the ferromagnetic detection system may generate a warning signal that causes at least one warning light to change from a green color when no event is detected to a red color when a detection event occurs, and the monitor may display a representation of the warning light that is green when the warning light itself is green and which changes to red when a detection event occurs.

The display may present a pictorial representation of the detection system and the door that is protected by the system on the screen. This could be heavily stylized or an almost photo like representation of the system, or even an actual photographic representation of the system that is overlaid with the warning signal (or two photographs could be used—one showing the system when no warning is issued and thither when a warning is issued with the processor selecting between the two so that the relevant photograph is shown at any given time on the display).

The monitoring system may receive a signal indicating whether the door is open or closed and may display on the screen a representation of the door that is open or closed according to the position of the actual door.

The display may be configured to additionally supply training information and/or videos, user manuals, and/or procedures to a user. The display may also enable a user to invoke a systems test of the detector system and to report the outcome of the systems test.

The monitoring system may also be configured to modify the settings of the detector system in accordance with a user input.

The invention may provide in another aspect a doorway protection system for an MRI room or other protected area, the protection system comprising a combination of a detection system, such as a ferromagnetic detection system, that generates a warning signal in the event of a detection event and a monitoring system of the first aspect.

The ferromagnetic detection system may in use be installed at a doorway to an MRI room to protect the room from users unintentionally bringing ferromagnetic objects into the room. It may be installed in a location away from a doorway where it can be used for patient screening.

The display may be located in a room that is distant from the doorway and from the MRI room.

The system may include a camera or video recorder that captures images of the doorway and of part of the ferromagnetic detection system. This will capture images of any person or persons attempting to pass through the doorway with a ferromagnetic object.

According to a still further embodiment, there is provided a method of logging detection events related to a detection system including a warning device that in use modifies its status to indicate a detection event when the detection system detects a detectable object, the method comprising the steps of:

receiving operating information from a detection system on a monitoring system presenting to a user information relating to the detection system with the monitoring system;

modifying the presented information in accordance with the status of a warning device associated with the detection system to alert the user when the warning device indicates a detection event;

a user operating a user interface to indicate whether the detection event was the result of an unintentional action or an intentional action in response to the presentation of the detection event;

whereupon data relating to the detection event is automatically stored in a memory unit if the detection event has been indicated through the user interface to be the result of an unintentional action.

The presented information may be displayed on a monitor.

The displayed information may comprise a visual representation of one or more parts of the ferromagnetic detection system.

It may also be desirable for a log file to be generated that includes a set of the stored data relating to a range of unintentional events that is suitable for exporting from the device as a digital or printed record. The user may be prompted to select a date range for use in generating the log file.

Data may not be stored when the user input indicates that the detection event was the result of an intentional action.

At least part of the data may be obtained from the detection system. The data may also or otherwise include data obtained from elsewhere other than the detection system.

The data may include the time of the event, a still or video recording of the area that is protected by the detection system, and/or the magnitude of the signal that triggered the event.

The displayed information may be modified in accordance with at least one operating characteristic of the detection system. The at least one operating characteristic may include whether a door associated with the detection system is in an open or closed state.

The disclosed devices/methods may also be applied to patient screening FMDS. These are not generally located at an MRI door, rather in or near the patient changing area and are for the purpose of checking the patient for ferromagnetic objects prior to MRI. Sometimes the patient may have a ferromagnetic medical implant that has been deemed safe to scan in an MRI but will nonetheless trigger the FMDS alert. The monitor may be applied in the same manner to allow the user to declare an intentional event in this case. It will be appreciated that the other aspects of data logging such as usage, number of unintentional alerts etc. are equally applicable.

It will be apparent that the disclosed devices/methods may be applied to any detector system for which a user input to record intentional events is required. For example security measures such as archway metal detectors, millimeter wave imagers, and olfactory sensor systems may benefit when there are needs to log intentional events that cause alerts.

The addition of a monitor to a control room opens many possibilities for further advantageous uses. One of these may be to select and display from a stored repository of information, for example training materials, procedures, policies, help information, instruction manuals for the detector etc. The stored information may be videos, sound recordings or text. Another use may be for the user to input to the monitor to change or adjust the behavior of the detector. Examples include to invoke a system test and then report the outcome, or to adjust sensitivity settings, alarm loudness or brightness, or set the detector system into different modes. Another example is to automatically generate safety reports on a regular basis. These may be downloaded from the monitor or automatically emailed to safety officers.

BRIEF DESCRIPTION OF THE DRAWINGS

The invention will now be described with reference to the accompanying drawings in which.

DETAILED DESCRIPTION

An embodiment of a monitoring system 100 of the invention is shown in the accompanying drawings. The monitoring system 100 comprises a monitor 102 on which information relating to a linked detection system 104, which in this case is a ferromagnetic detection system, is displayed. The detection system 104 could also be any other sort of detection system. This monitoring system 100 will be located perhaps some distance away from the ferromagnetic detection system 104 in a control room for the MRI machine. The ferromagnetic detection system 104 on the other hand will be located in a position where it can protect a doorway 106 into the MRI room in which an MRI room is located, typically by being mounted to the wall 108 alongside the doorway 106 on the outside of the MRI room where it is visible to anyone trying to enter the room.

Figure 3:
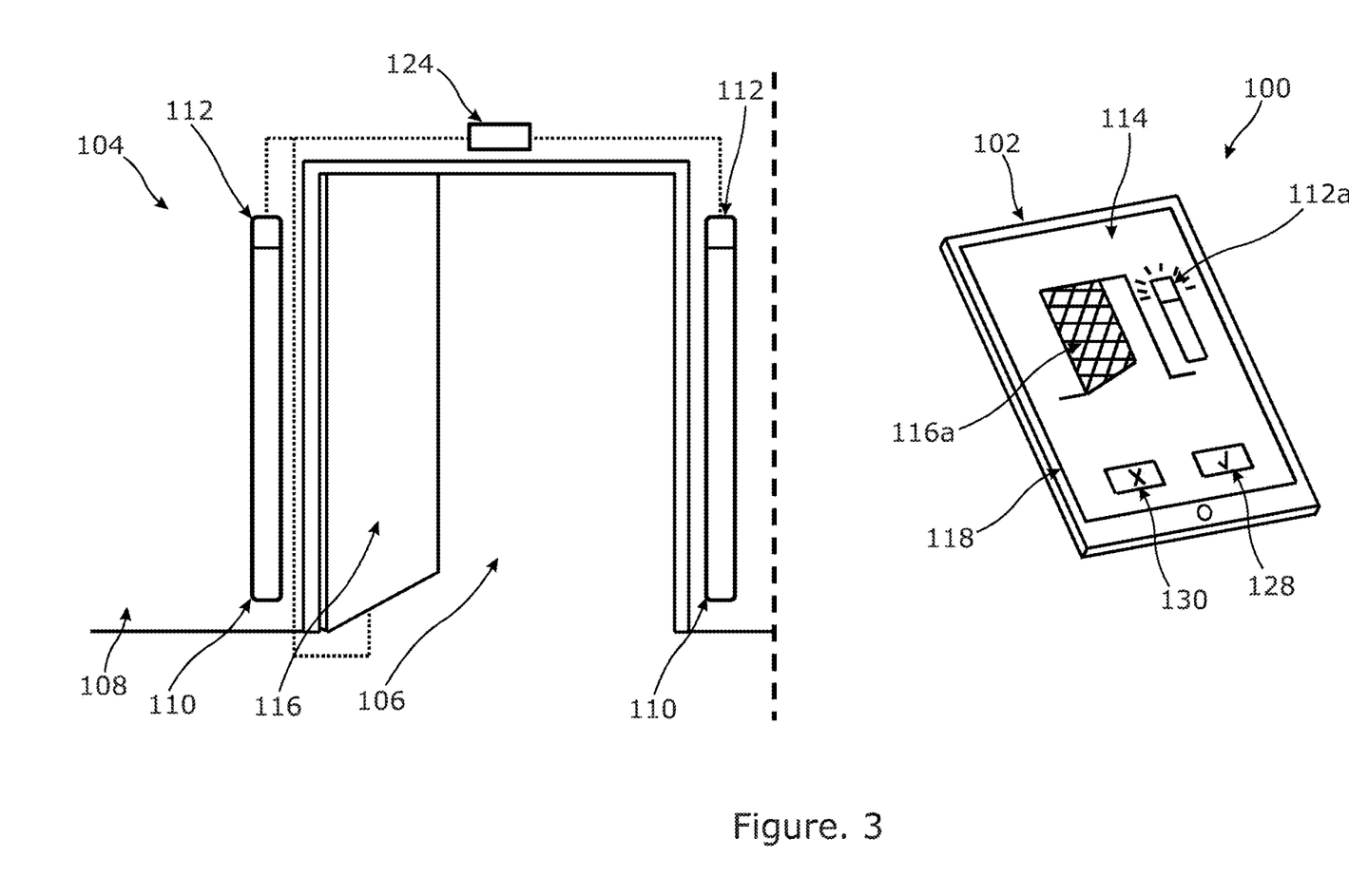
FIG. 3 is a depiction of an embodiment of the invention of FIG. 1 using a tablet computer.

The depicted embodiment, as shown in FIG. 3, presents the information on the monitor 102 as a visual representation of a protected doorway 106, the detection system 104 in this example being fitted to the sides of the doorway 106 as two elongate poles 110, each with a built in warning light 112 at the top. Of course other forms of displayed information may be used additionally or alternatively, such as a table on the screen including a list of characteristics of the system 100. The applicant prefers that the monitor 102 displays something that looks like the ferromagnetic detection system 104 as it is very intuitive to the user.

The ferromagnetic detection system 104 with which the monitoring system 100 can be used may be of the type described in the applicant's earlier applications GB 2395276 and WO 2012/022971 and the teaching of both of those applications is incorporated herein in their entirety by reference.

The displayed image 114 of the system 100 is actively modified by the monitoring means 100 when in use to mirror the function of the ferromagnetic detection system 104. However, in a modification to modifying the image, or in addition, an audible sound may be presented to the user to indicate that a detection event has occurred, the audible sound being transmitted by a speaker 115, Hence, as the door 116 that is protected opens and closes the door 116a displayed on the screen 118 will also open and close, and when a warning signal is issued by changing the color of the warning lights 112 of the ferromagnetic detection system 104 then the lights 112a in the representation 114 on the screen 118 will also change. This allows an operator looking at the monitor 102 to see the operation of the ferromagnetic detection system 104.

To modify what is shown on the monitor 102, or to raise the audible alert, the monitoring system 100 receives information via a receiver 120 from an associated transmitter 122 of the ferromagnetic detection system 104 Each of the receiver 120 and transmitter 122 may, as shown, also be capable of the other of transmitting and receiving, in order that two-way communication is possible. The receiver 120 and transmitter 122 may be hard-wired together or may communicate wirelessly, for example over a suitable radio protocol. The transmitter 122 may be housed within a controller 124, as shown in FIG. 3. The controller 124 receives information from within the ferromagnetic detection system 104. Specifically, information regarding the status of any one of a number of warning devices 112 is collected such that if a warning device 112 is triggered, the controller 124 is able to pass this information onto the monitoring system 100. Other information received by the controller 124 may include information relating to whether the door 116 in the doorway 106 monitored by the ferromagnetic detection system is open or closed, as shown in the present embodiment.

The ferromagnetic detection system 104 itself is configured to detect the presence of ferromagnetic materials in an area protected by the ferromagnetic detection system 104. In the example shown this area is the vicinity of a doorway 106 to an MRI room, for example, in order to provide an aural or visual warning in the event that a ferromagnetic object is brought close to or through the doorway. In this manner, any person bringing such an object into the area is alerted to this fact and, if the object is being unintentionally brought into the MRI room or other protected area, may be alerted that they should not do so.

The ferromagnetic detection system 104 may include a plurality of ferromagnetic sensors which may be connected together in order to produce a magnetic gradiometer or other type of sensor.

Upon receiving a signal from the transmitter 122, a processor 126 will cause the displayed information 114 on the monitor 102 to be modified, in the depicted embodiment by causing a representation of a warning device 112a to flash. In the depicted embodiment, the monitor 102 is a tablet computer and therefore this information is shown on the touchscreen of the device. At this point, a user of the monitoring system 100 will be alerted to the fact that the ferromagnetic detection system 104 has been activated and the warning signal has been triggered.

Figure 4A:
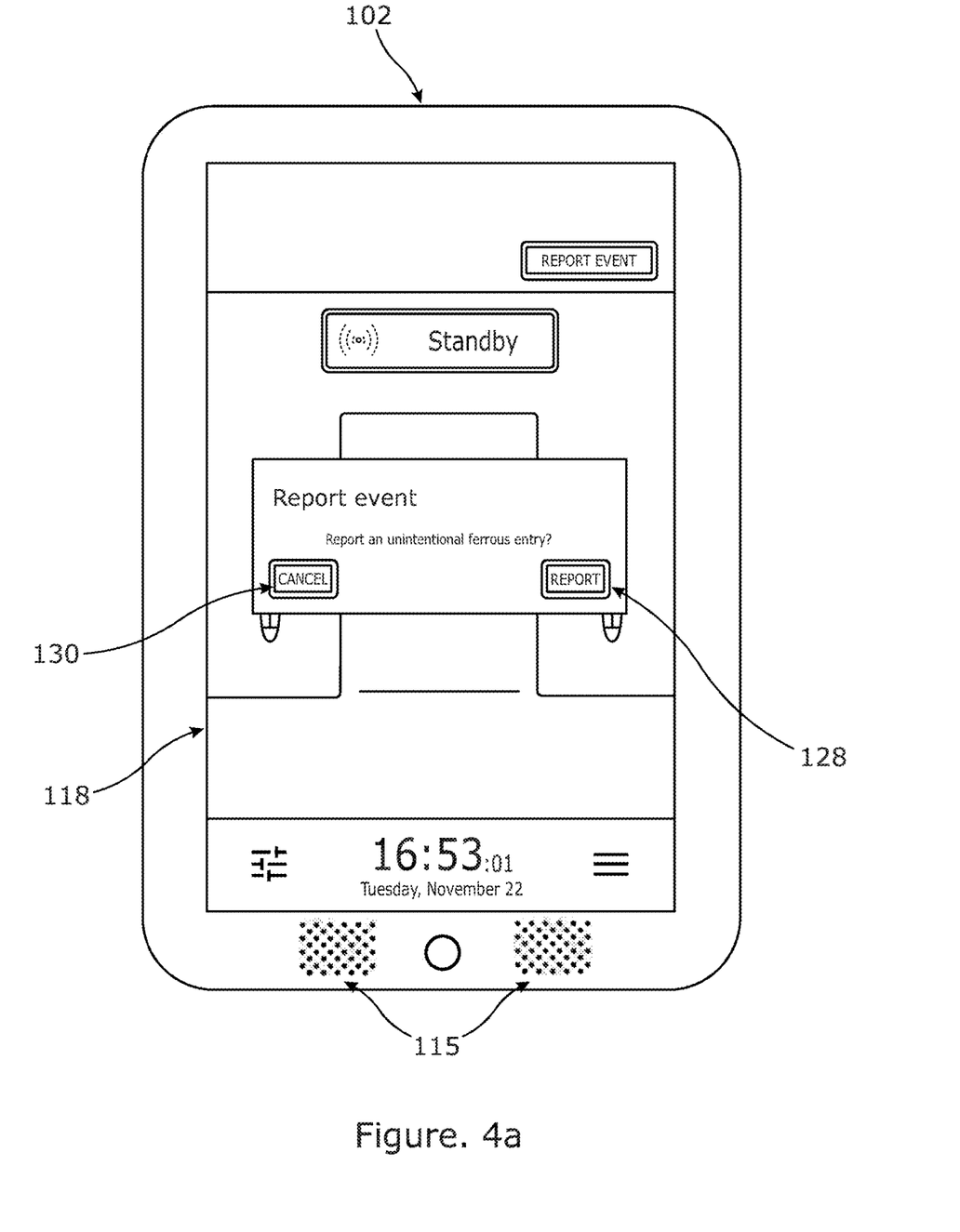
FIG. 4a is a depiction of an embodiment of the invention of FIG. 1 showing the prompt for a user input.

Importantly, when a warning has been triggered by the ferromagnetic detection system 104, referred to here as a detection event, the processor 126 of the monitoring system 100 will issue a prompt to the user asking the user to indicate to the system whether or not the detection event was the result of an intentional or unintentional action. As shown in FIG. 4a, the prompt comprises a large button 128 appearing on the screen. The screen 118 in this example is touch sensitive and doubles as a user input device, so the user can tap the button if the event was unintentional or tap the dismiss button 130 if not. Alternatives to on-screen buttons may be used in place of this, depending on the type of monitor 102 used. For example, if the screen is not touch sensitive a keypad can be provided for the user to respond to the prompt.

The user may be made aware of planned intentional actions in advance of them being initiated. In this way, the user will be able to manually match a detection event with a planned intentional action and then input this indication to the monitoring system 100.

Figure 4B:
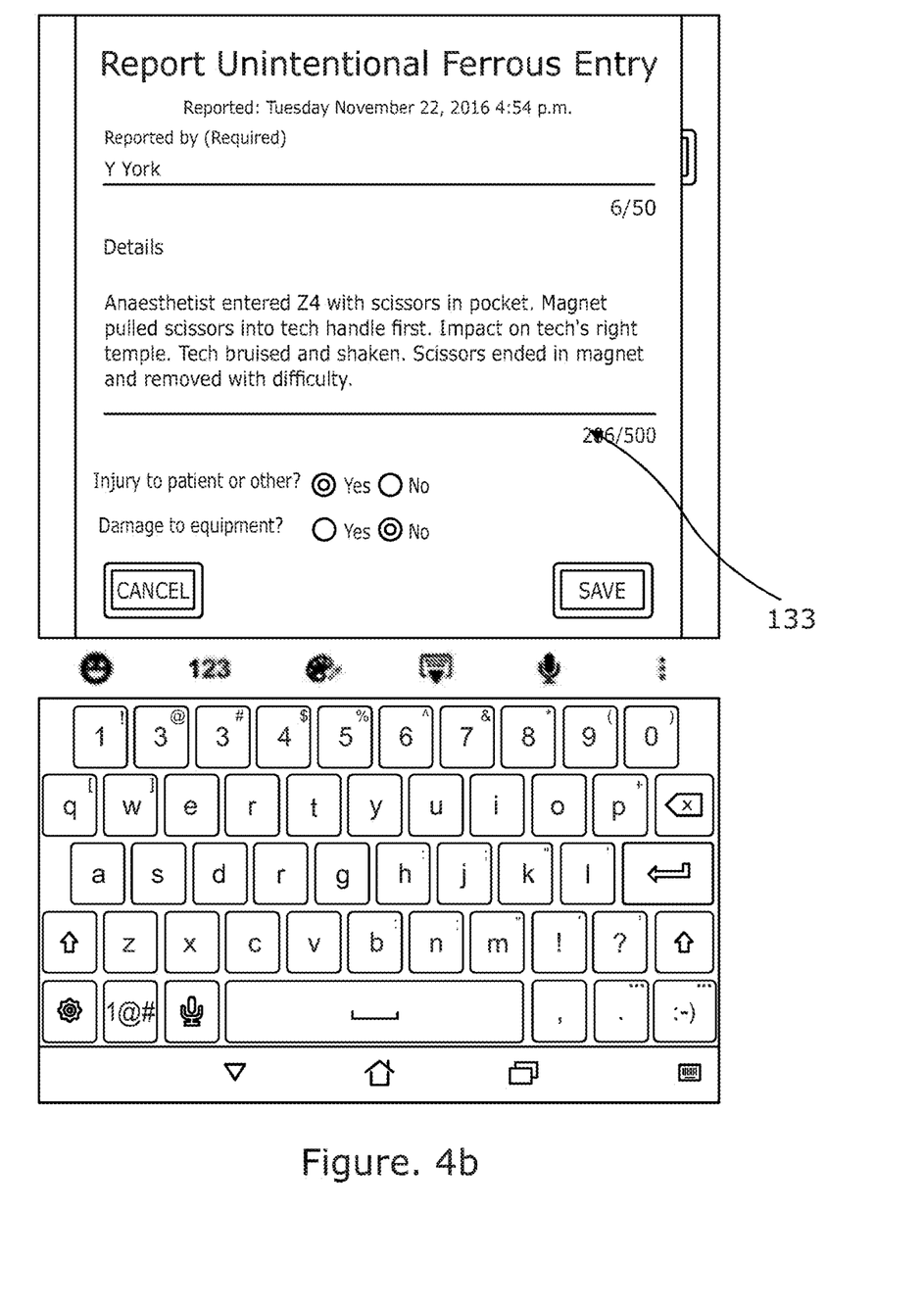
FIG. 4b is a depiction of the embodiment of FIG. 4a showing a data input screen.

As it is used, the monitoring system 100 will build up data relating to each detection event. Information relating to each detection event may be processed by the processor 126 and stored in the memory 132. A base level of information may be stored for each detection event, whether or not it is intentional, such as the time and date of the detection event. In addition, where the detection event is indicated as being unintentional, extra information is stored which could include images and videos of the detection event, for example, or other related information. FIG. 4b, for example, includes a data entry form 133 which includes a text box for free text entry into which information regarding the detection event can be stored. Other details may be stored as multiple choice inputs, such as whether an injury or any damage has occurred, as shown.

Figure 5:
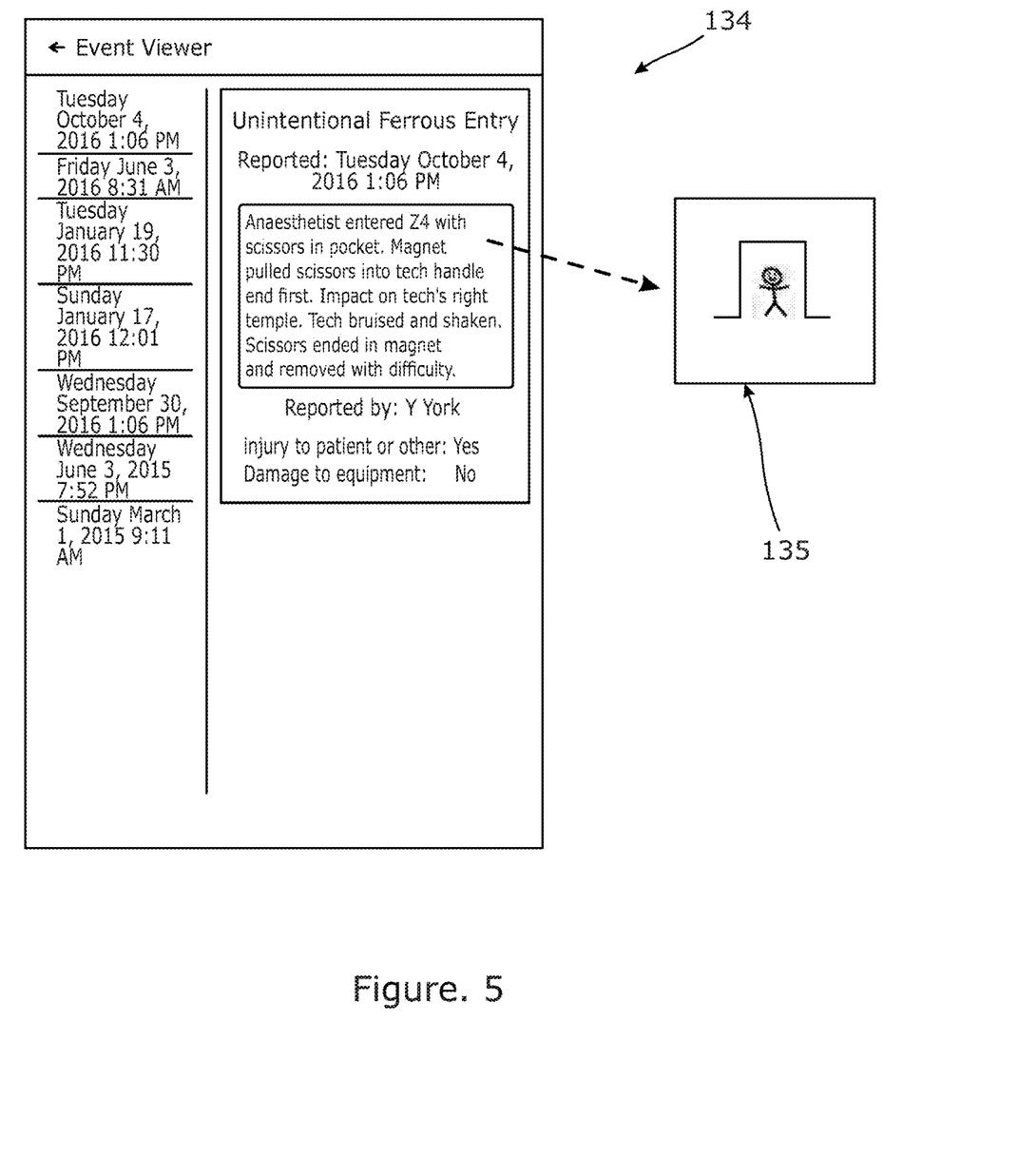
FIG. 5 is an example of a log file generated for a given date range.

This data may then be stored in a log file 134 such as the one shown in FIG. 5. As depicted, the log file 134 shows each detection event over a selected period, although, when generated, the user may request any date range of any desired length.

In the depicted example, the log file 134 includes a number of data fields including the date and time of the detection event, and whether the detection event was intentional or not, as designated by the user. Where the detection event has been designated as unintentional, the log file 134 may also store additional information such as a still image 135 or video of the MRI doorway, which may, as shown, be clicked through to by the user. The log file may also include, for example, the magnitude of the signal which causes a detection event.

The log file 134 may be generated by a user at will. For example, the user may be able to interrogate the monitoring system 100 at any time in order to generate a log file 134 of the detection events. Such an interrogation could obtain information from any date period required. Additionally or alternatively, the monitoring system may automatically generate a log file 134 on a regular basis, for example weekly or monthly, the log file 134 then being stored in the memory 132 or transmitted remotely for further analysis when desired.

Figure 6A:
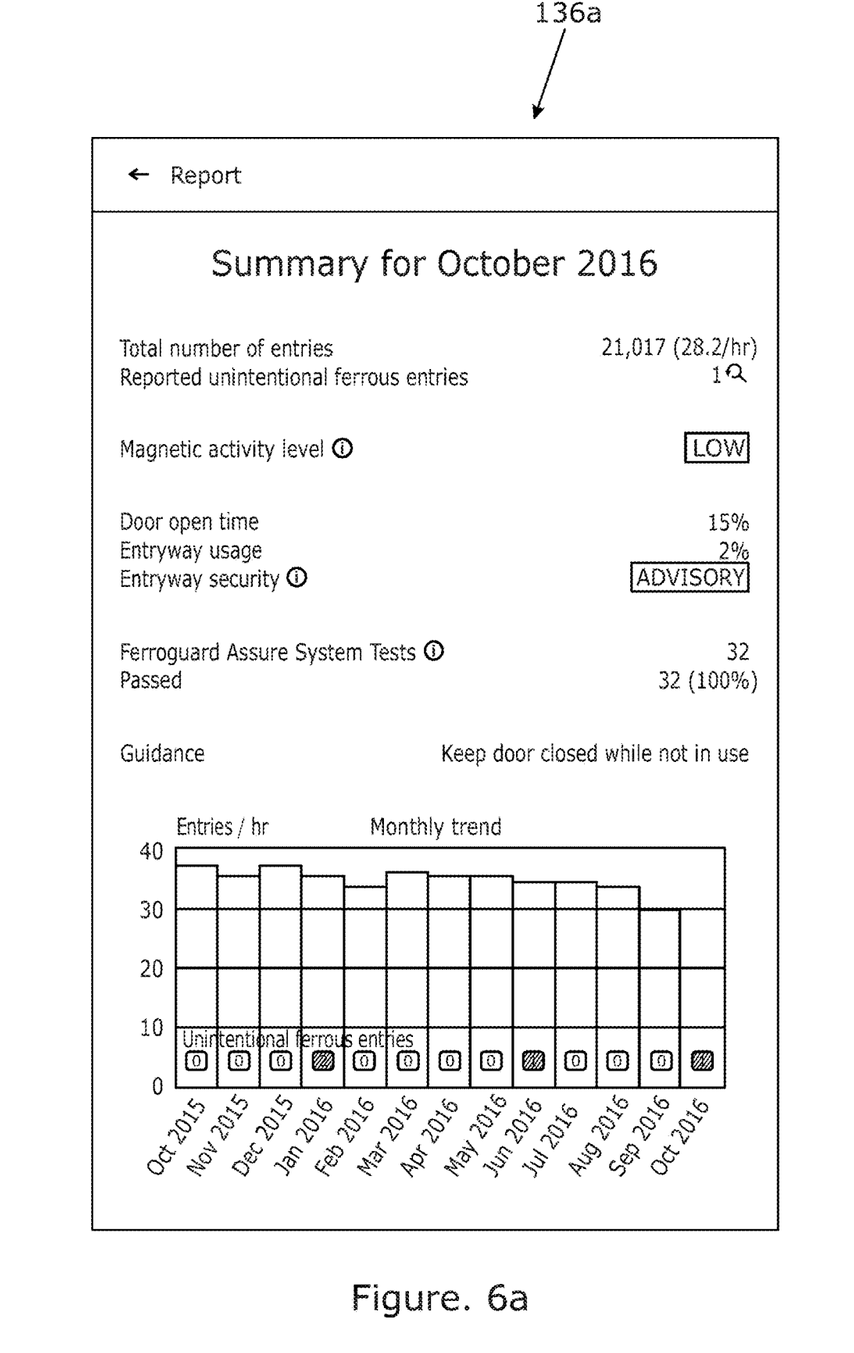
FIGS. 6a and 6b are graphical displays of detection events.
Figure 6B:
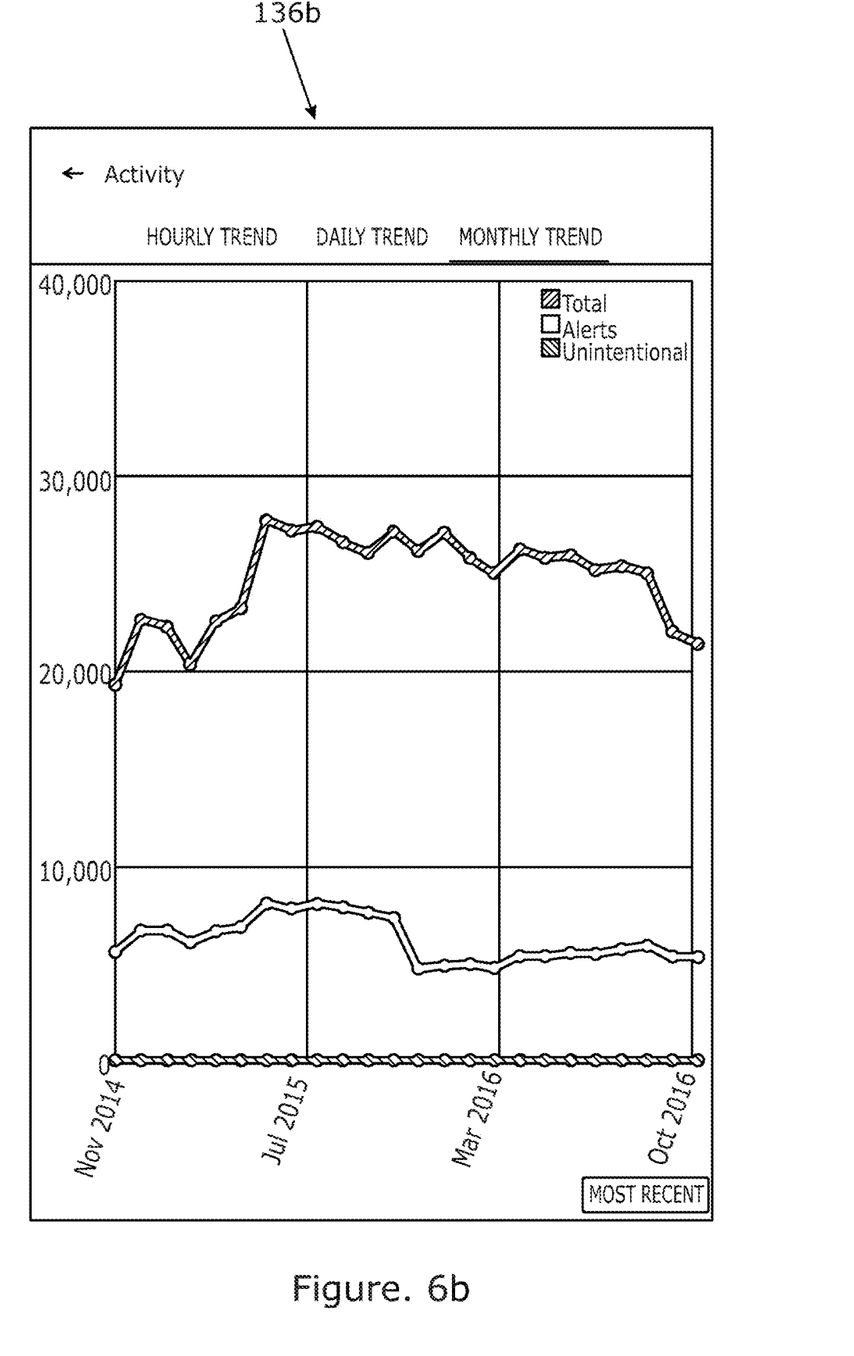

It may also be desirable to use the log file 134 to generate graphs or other depictions of the data stored in the log file, to assist in any analysis. Two example graphs 136a, 136b are shown in FIGS. 6a and 6b The graph of FIG. 6a shows a monthly trend of detected entries into the MRI area and an associated number of unintentional detection events. The graph 136b of FIG. 6b also shows a monthly trend, but in more detail showing the entries into the protected area, the detection events, and the unintentional detection events. Further information shown on screen in addition includes the magnetic activity level, the percentage of time the door is open and the results of system self-tests.

Figure 1:
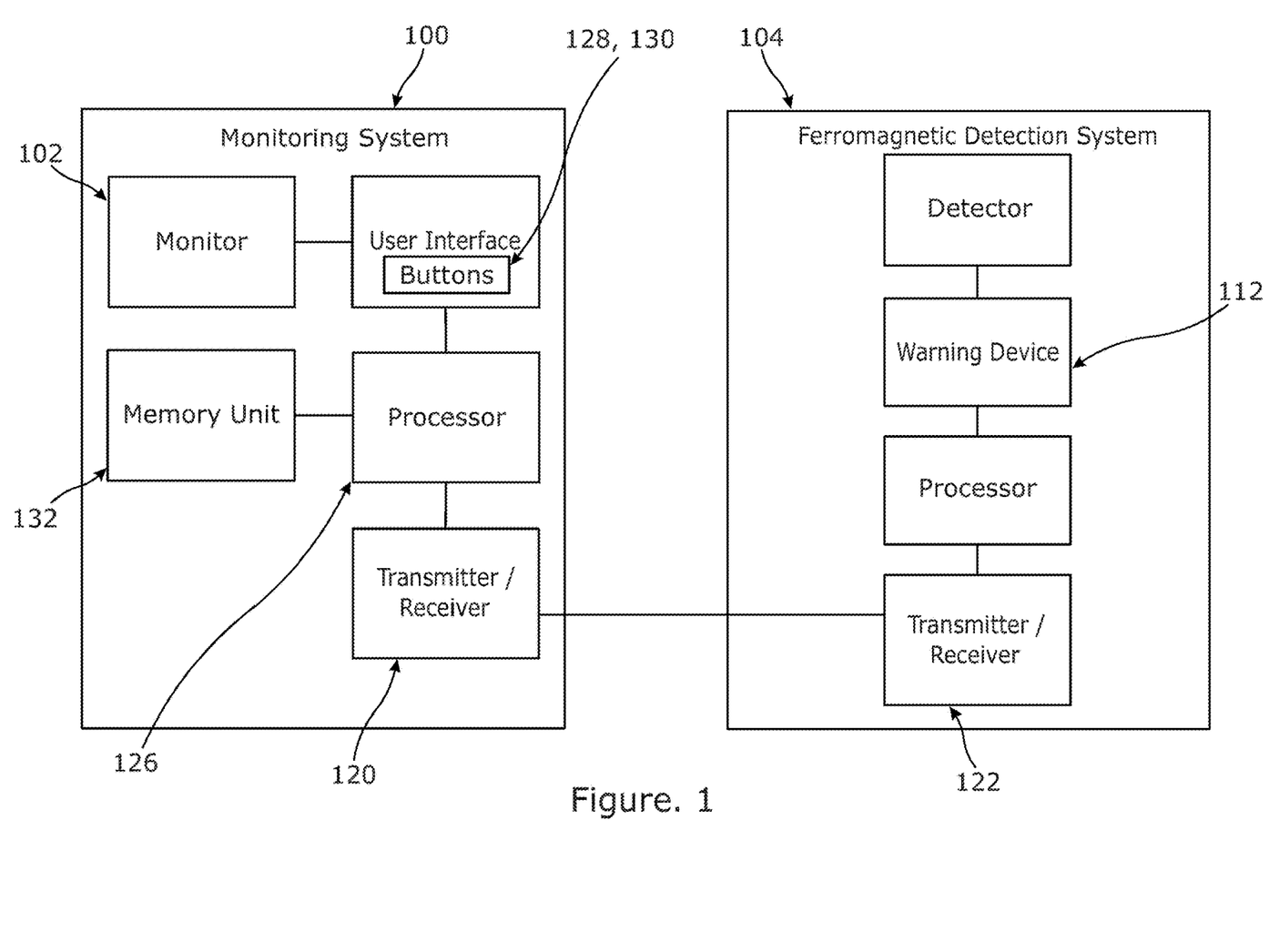
FIG. 1 is a diagrammatic view of a monitoring system in accordance with the first aspect of the invention and a ferromagnetic detection system.
Figure 2:
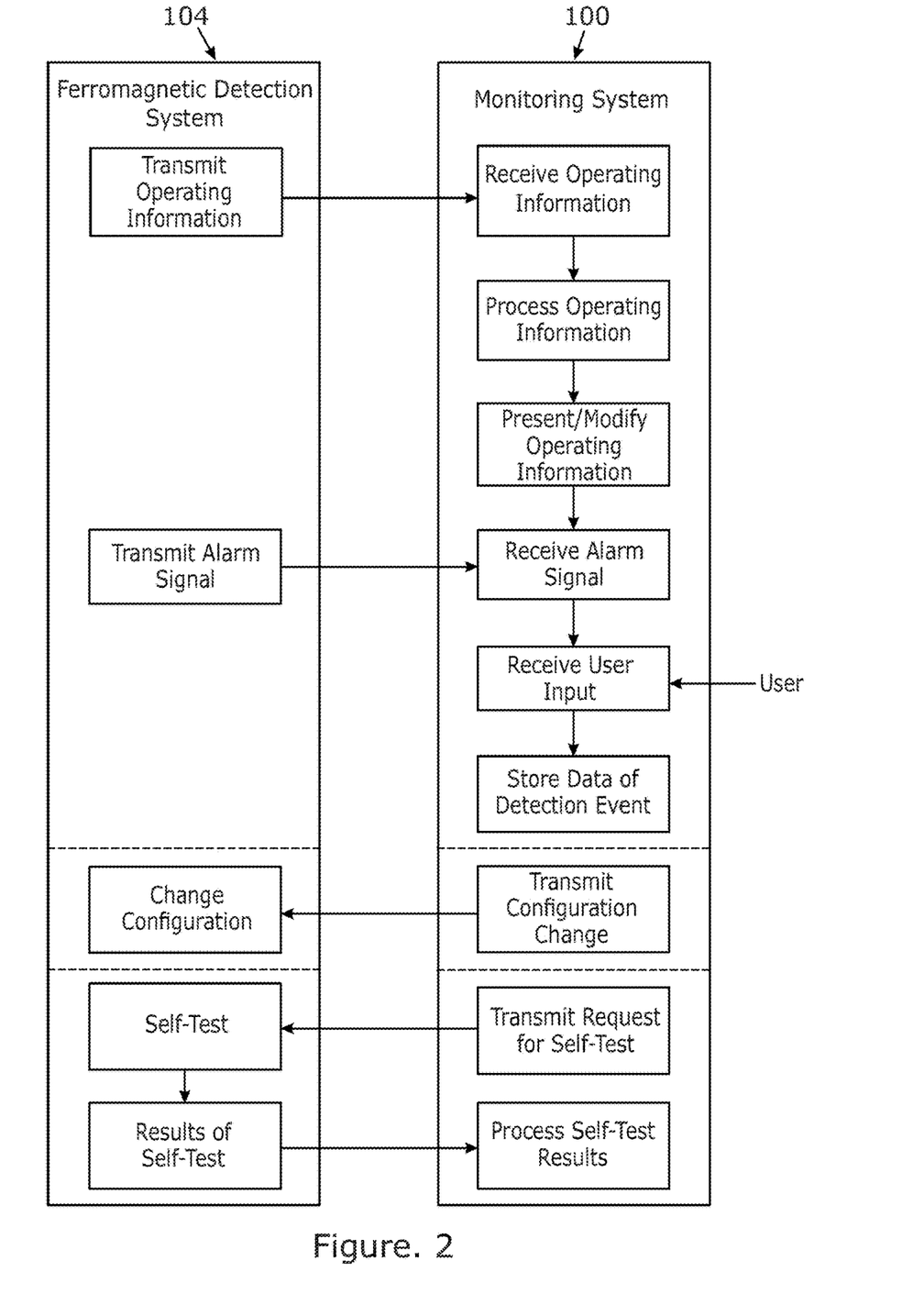
FIG. 2 is a diagrammatic view of a monitoring method in accordance with the second aspect of the invention.

Self-tests of the detection system 104 can be initiated by the monitoring system 100 as shown in FIG. 2. The self-test will check many attributes of the detection system 104 in order to ascertain if it is working correctly. The results of the self-test can then be transmitted back to the monitoring system 100 where they can be analyzed, where necessary, and displayed to a user.

The monitoring system 100 may also be used to adjust the configuration of the detection system 104. Such a configuration change can be instigated by a user input on the monitor 102, for example.

Figure 7A:
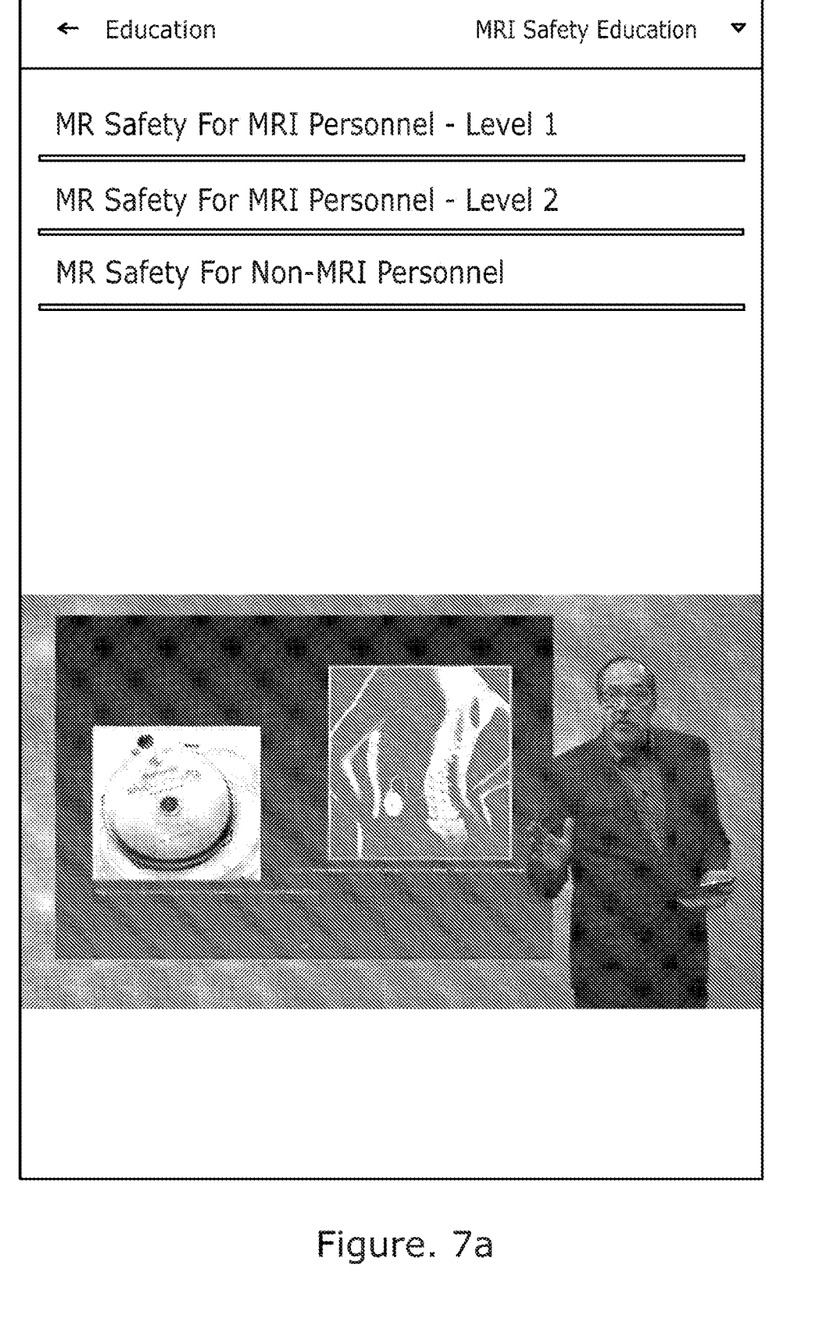
FIGS. 7a and 7b are examples of training materials displayable on the monitoring system.
Figure 7B:
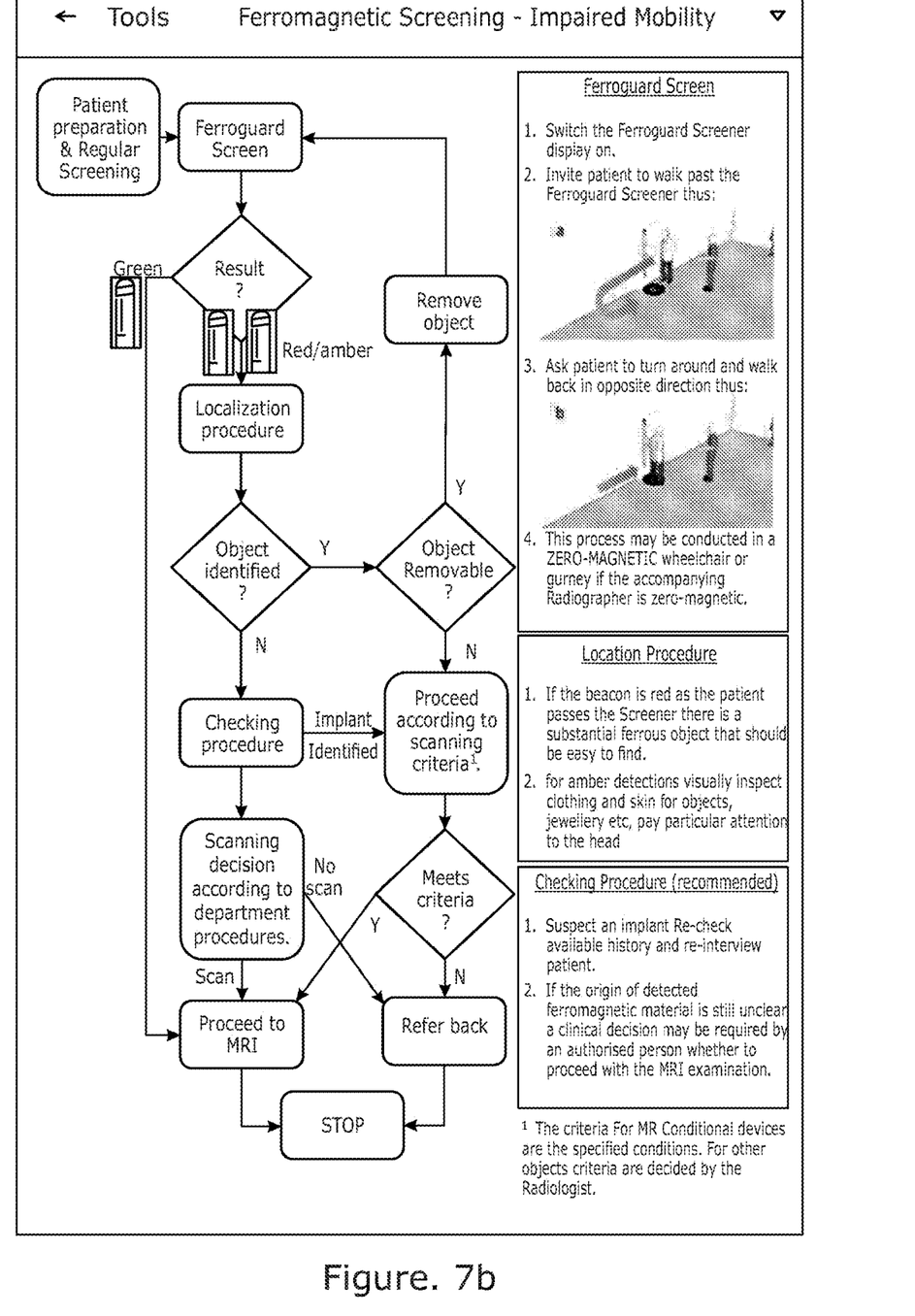

As shown in FIGS. 7a and 7b, the monitoring system 100 may also be configured to display certain other information which could be useful for the functioning of the monitoring system 100 or detection system 104. FIG. 7a, for example, shows a selection of training videos which can be stored on the monitoring system or on a network connected to the monitoring system and can be used to train personnel in the use of the systems 100, 104. Different training videos may be used for different types of personnel, such as MRI personnel and non-MRI personnel. FIG. 7b shows a flowchart to instruct a user how to use screening equipment associated with the detection system. This, the user of the monitoring system 100 may be instructed in the proper use of the screening equipment which may help to lower instances of unintentional detection events.

The invention claimed is:

1. A monitoring system for use in combination with a detection system that generates a warning signal to indicate a detection event when the detection system detects a detectable object, the monitoring system comprising:
   a processor configured to present information to a user to alert the user when the warning signal indicates the detection event;
   a user interface configured to receive a user input in response to the presentation of the detection event that generates a user generated signal indicative of whether the detection event was a result of an unintentional action or an intentional action; and
   a display by which the processor displays the information to the user by modifying one or more images presented on the display according to a status of the warning signal, wherein the display and the user input are located remotely from the detection system where the detection system is otherwise not visible to a user;
   wherein the detection system is a ferromagnetic detection system and the detectable object is a ferromagnetic object;
   wherein the detection system is fitted to a doorway to an MM room to protect the doorway and the display is located in a control room remote from the doorway; and
   wherein the processor is further configured to automatically store data relating to the detection event in a memory unit when the user generated signal indicates that the detection event was the result of the unintentional action.

2. A monitoring system according to claim 1, wherein the presented information comprises a visual representation of one or more parts of the detection system.

3. A monitoring system according to claim 2, wherein the parts include a representation of one or more warning lights incorporated into the detection system.

4. A monitoring system according to claim 1, wherein the processor and display are integrated into a single housing with the user input device.

5. A monitoring system according to claim 1, wherein the monitoring system is portable.

6. A monitoring system according to claim 1, wherein the monitoring system is connected to a warning device by a hard-wired connection or wirelessly.

7. A monitoring system according to claim 1, wherein the processor is configured to generate, in use, a log file that includes a set of the stored data relating to a range of unintentional events.

8. A monitoring system according to claim 7, wherein the log file is automatically generated at predetermined intervals.

9. A monitoring system according to claim 7, wherein the processor is configured to prompt the user to select a date range for use in generating the log file.

10. A monitoring system according to claim 1, wherein the processor does not store data when the user input indicates that the detection event was the result of the intentional action.

11. A monitoring system according to claim 1, wherein at least part of the data that is stored is obtained from the detection system.

12. A monitoring system according to claim 1, wherein the data includes data obtained from elsewhere than the detection system.

13. The monitoring system according to claim 1, wherein the data includes at least one of:
the time of the event,
a still or video recording of an area that is protected by the detection system,
the magnitude of the signal that triggered the detection event,
the position or status of a door associated with the detection system,
occurrences of entry or exit through the door associated with the detection system, or
any other output from the detection system.

14. A monitoring system according to claim 1, further comprising:
a receiver configured to receive an alarm signal from a warning device upon the occurrence of a detection event,
wherein the processor performs a predetermined function based on the signal received from the receiver.

15. A monitoring system according to claim 1, wherein the user interface comprises a button.

16. A monitoring system according to claim 15, wherein the button is an on-screen button.

17. A monitoring system according to claim 1, wherein the display is configured to additionally display training information and/or videos, user manuals, and/or procedures to a user.

18. A monitoring system according to claim 1, wherein the display is configured to enable a user to invoke a systems test of the detection system and to report the outcome of the systems test.

19. A monitoring system according to claim 1, further comprising:
configured to modify the settings of the detection system in accordance with a user input.

20. A method of logging detection events related to a ferromagnetic detection system fitted to a doorway to an MRI room to protect the doorway and including a warning device that, in use, modifies its status to indicate a detection event when the detection system detects a ferromagnetic object, the method comprising:
receiving operating information from the ferromagnetic detection system on a monitoring system;
displaying, to a user, information relating to the ferromagnetic detection system on a display of the monitoring system located in a control room remote from the ferromagnetic detection system where the ferromagnetic detection system is otherwise not visible to the user;
modifying one or more images presented on the display according to a status of the warning device associated with the ferromagnetic detection system to alert the user when the warning device indicates the detection event;
accepting, via a user interface, a user input in response to the presentation of the information to indicate whether the detection event was the result of an unintentional action or an intentional action; and
automatically storing data relating to the detection event in a memory unit if the detection event has been indicated through the user interface to be the result of the unintentional action.

21. A method according to claim 20, wherein the displayed information includes a visual representation of one or more parts of the ferromagnetic detection system.

22. A method according to claim 20, further comprising:
generating a log file including a set of the stored data relating to a range of unintentional events.

23. A method according to claim 20, wherein the user is prompted to select a date range for use in generating the log file.

24. A method according to claim 20, wherein data is not stored when the user input indicates that the detection event was the result of the intentional action.

25. A method according to claim 20, wherein at least part of the data that is stored is obtained from the ferromagnetic detection system.

26. A method according to claim 20, wherein the data includes data obtained from elsewhere other than the ferromagnetic detection system.

27. A method according to claim 20, wherein the data includes the time of the event, a still or video recording of an area that is protected by the ferromagnetic detection system, and/or a magnitude of a signal that triggered the event.

28. A method according to claim 20, further comprising:
modifying the presented information in accordance with at least one operating characteristic of the ferromagnetic detection system.

29. A method according to claim 28, wherein the at least one operating characteristic includes whether a door associated with the ferromagnetic detection system is in an open or closed state.

* * * * *

UNITED STATES PATENT AND TRADEMARK OFFICE
CERTIFICATE OF CORRECTION

| | | |
|---|---|---|
| PATENT NO. | : 11,609,286 B2 | Page 1 of 1 |
| APPLICATION NO. | : 16/464585 | |
| DATED | : March 21, 2023 | |
| INVENTOR(S) | : Thomas John Horton et al. | |

It is certified that error appears in the above-identified patent and that said Letters Patent is hereby corrected as shown below:

On the Title Page

Item (73), Assignee, Change:
"Mftrasens Limited"
To:
--Metrasens Limited--

Signed and Sealed this
Sixteenth Day of May, 2023

Katherine Kelly Vidal
*Director of the United States Patent and Trademark Office*